United States Patent
Kajino

(10) Patent No.: US 10,181,806 B2
(45) Date of Patent: Jan. 15, 2019

(54) PIEZOELECTRIC ELEMENT DRIVE CIRCUIT AND ROBOT

(71) Applicant: Seiko Epson Corporation, Tokyo (JP)

(72) Inventor: Kiichi Kajino, Matsumoto (JP)

(73) Assignee: Seiko Epson Corporation (JP)

( * ) Notice: Subject to any disclaimer, the term of this patent is extended or adjusted under 35 U.S.C. 154(b) by 516 days.

(21) Appl. No.: 15/011,942

(22) Filed: Feb. 1, 2016

(65) Prior Publication Data

US 2016/0226404 A1    Aug. 4, 2016

(30) Foreign Application Priority Data

Feb. 2, 2015 (JP) ................................. 2015-018398

(51) Int. Cl.

| | |
|---|---|
| *H01L 41/09* | (2006.01) |
| *H02N 2/14* | (2006.01) |
| *H02N 2/00* | (2006.01) |
| *H02N 2/10* | (2006.01) |
| *H01L 41/04* | (2006.01) |

(52) U.S. Cl.
CPC ............ *H02N 2/14* (2013.01); *H01L 41/042* (2013.01); *H01L 41/09* (2013.01); *H02N 2/004* (2013.01); *H02N 2/0075* (2013.01); *H02N 2/103* (2013.01)

(58) Field of Classification Search
CPC ........ H02N 2/14; H02N 2/004; H02N 2/0075; H02N 2/103; B25J 9/12; H01L 41/042; H01L 41/09
USPC ......................................................... 310/317
See application file for complete search history.

(56) References Cited

U.S. PATENT DOCUMENTS

| | | |
|---|---|---|
| 2003/0184190 A1 | 10/2003 | Kataoka |
| 2004/0256956 A1 | 12/2004 | Miyazawa |
| 2006/0049715 A1 | 3/2006 | Onishi |
| 2013/0140954 A1 | 6/2013 | Kamijo et al. |

FOREIGN PATENT DOCUMENTS

| | | |
|---|---|---|
| CN | 103151951 A | 6/2013 |
| DE | 10008752 A1 | 9/2001 |
| JP | 03-016188 A | 1/1991 |
| JP | 04-075477 A | 3/1992 |
| JP | 05-243632 A | 9/1993 |
| JP | S07-024416 A | 1/1995 |

(Continued)

OTHER PUBLICATIONS

Extended European Search Report for Patent Application No. EP16153337.7 dated Jun. 29, 2016 (7 pages).

*Primary Examiner* — Thomas Dougherty
(74) *Attorney, Agent, or Firm* — Harness, Dickey & Pierce, P.L.C.

(57) ABSTRACT

A piezoelectric element drive circuit includes a piezoelectric element array in which the N number (N is an integer of two or more) of piezoelectric elements respectively having a piezoelectric substance whose thickness is 0.05 μm to 20 μm and two electrodes interposing the piezoelectric substance therebetween are connected in series, a first generation circuit that supplies a voltage including an AC component and a DC component to the piezoelectric element array, and a second generation circuit that supplies a voltage including the DC component to the M number (M is an integer of one or more) of connection points within the (N−1) number of connection points between two adjacent piezoelectric elements in the piezoelectric element array.

14 Claims, 11 Drawing Sheets

(56) References Cited

FOREIGN PATENT DOCUMENTS

| | | | |
|---|---|---|---|
| JP | 2003-289681 | A | 10/2003 |
| JP | 2004-320979 | A | 11/2004 |
| JP | 2005-287247 | A | 10/2005 |
| JP | 2014-079134 | A | 5/2014 |
| WO | WO-2004-112158 | A1 | 12/2004 |
| WO | WO-2009-155891 | A1 | 12/2009 |

COMPARATIVE EXAMPLE

FIRST EMBODIMENT

PIEZOELECTRIC ELEMENT DRIVE CIRCUIT AND ROBOT

BACKGROUND

1. Technical Field

The present invention relates to a piezoelectric element drive circuit and various apparatuses such as a robot including a piezoelectric element drive circuit.

2. Related Art

In the related art, a piezoelectric actuator (piezoelectric drive device) using a piezoelectric element is known (for example, JP-A-2004-320979). According to a basic configuration of the piezoelectric drive device, four piezoelectric elements are configured to be arranged in two rows and two columns on two surfaces of a reinforcing plate. Eight piezoelectric elements in total are disposed on both sides of the reinforcing plate. Each of the piezoelectric elements is a unit which interposes each piezoelectric substance between two electrodes. The reinforcing plate is used as one electrode of the piezoelectric element. One end of the reinforcing plate has a protrusion portion disposed in order to rotate a rotor by coming into contact with the rotor serving as a driven body. If an AC voltage is applied to the two piezoelectric elements arranged at opposite angles among the four piezoelectric elements, the two piezoelectric elements perform expansion and contraction movement. In response to the movement, the protrusion portion of the reinforcing plate performs reciprocating movement or elliptical movement. Then, in response to the reciprocating movement or the elliptical movement of the protrusion portion of the reinforcing plate, the rotor serving as the driven body is rotated in a predetermined rotation direction. The rotor can be rotated in the opposite direction by switching from the two piezoelectric elements to which the AC voltage is applied to the other two piezoelectric elements.

In the related art, as the piezoelectric substance used for the piezoelectric drive device, a so-called bulky piezoelectric substance is used. The "bulky piezoelectric substance" described herein means a piezoelectric substance whose thickness is 100 µm or greater. The reason for using the bulky piezoelectric substance is to increase the thickness of the piezoelectric substance in order to sufficiently strengthen force applied to the driven body from the piezoelectric drive device.

According to the piezoelectric drive device in the related art, two piezoelectric elements arranged at opposite angles are connected in parallel. Consequently, there is a problem in that the piezoelectric drive device has a large electrostatic capacity and thus needs a large amount of currents in driving the piezoelectric drive device.

When the piezoelectric drive device is used by being accommodated in a small space (for example, inside a joint of a robot), there is a possibility that a wiring space may be insufficient in the piezoelectric drive device using the piezoelectric substance in the related art. Accordingly, there is a demand for a thinner piezoelectric substance. However, the electrostatic capacity is inversely proportional to a distance between the electrodes interposing the piezoelectric substance therebetween. For this reason, if the piezoelectric substance becomes thinner, the electrostatic capacity is forced to increase, thereby causing a problem of increased power consumption.

SUMMARY

An advantage of some aspects of the invention is to solve at least a part of the problems described above, and the invention can be implemented as the following forms or application example.

(1) An aspect of the invention provides a piezoelectric element drive circuit which drives a piezoelectric element. The piezoelectric element drive circuit includes: a piezoelectric element array in which the N number (N is an integer of two or more) of piezoelectric elements respectively having a piezoelectric substance whose thickness is 0.05 µm to 20 µm and two electrodes interposing the piezoelectric substance therebetween are connected in series; a first generation circuit that supplies a voltage including an AC component and a DC component to the piezoelectric element array; and a second generation circuit that supplies a voltage including the DC component to the M number (M is an integer of one or more) of connection points within the (N−1) number of connection points between two adjacent piezoelectric elements in the piezoelectric element array.

According to the piezoelectric element drive circuit, the multiple piezoelectric elements are connected in series. Accordingly, it is possible to decrease an electrostatic capacity of the whole piezoelectric elements. The voltage including the DC component is supplied to the connection point between the adjacent piezoelectric elements. Accordingly, it is possible to suppress a phenomenon in which an excessive voltage is applied to some piezoelectric elements within the piezoelectric elements which are connected in series. Therefore, it is possible to decrease power consumption of the piezoelectric element drive circuit by decreasing an effective electrostatic capacity of the whole piezoelectric elements.

(2) In the piezoelectric element drive circuit, the M may be equal to the (N−1), and the second generation circuit may supply voltages having respectively different voltage values to the (N−1) number of connection points.

With this configuration, the voltages having respectively different voltage values are supplied to the (N−1) number of connection points. Accordingly, it is possible to further prevent the phenomenon in which the excessive voltage is applied to some piezoelectric elements within the piezoelectric elements which are connected in series. Therefore, it is possible to decrease power consumption of the piezoelectric element drive circuit by decreasing an effective electrostatic capacity of the whole piezoelectric elements.

(3) In the piezoelectric element drive circuit, the voltage supplied by the second generation circuit may be a DC voltage.

With this configuration, it is possible to stabilize the voltage of the connection point between the piezoelectric elements. Therefore, it is possible to decrease power consumption by further decreasing an effective electrostatic capacity of the whole piezoelectric elements.

(4) The piezoelectric element drive circuit may further include an inductor that is connected between the second generation circuit and the M number of connection points.

With this configuration, the inductor can decrease the AC component which reversely flows in the drive circuit via the M number of connection points.

(5) In the piezoelectric element drive circuit, the second generation circuit may include a voltage divider circuit which generates a voltage supplied to the M number of connection points by dividing the voltage supplied from the first generation circuit.

With this configuration, it is possible to easily generate the voltage applied to the M number of connection points.

(6) In the piezoelectric element drive circuit, the voltage divider circuit may include a resistance element array in which multiple resistance elements are connected in series.

With this configuration, it is possible to easily generate the voltage applied to the M number of connection points.

(7) In the piezoelectric element drive circuit, the voltage divider circuit may include an inductor which is connected to the resistance element array in series.

With this configuration, it is possible to decrease an AC current which flows into the resistance element array. Therefore, it is possible to further decrease power consumption.

The invention can be implemented in various aspects. For example, in addition to the piezoelectric element drive circuit, the invention can be implemented in various aspects of various apparatuses and a drive method thereof, such as a piezoelectric drive device, a drive method of the piezoelectric drive device, a robot having the piezoelectric element drive circuit or the piezoelectric drive device mounted thereon.

BRIEF DESCRIPTION OF THE DRAWINGS

The invention will be described with reference to the accompanying drawings, wherein like numbers reference like elements.

DESCRIPTION OF EXEMPLARY EMBODIMENTS

Overall Configuration of Piezoelectric Drive Device

Figure 1A:
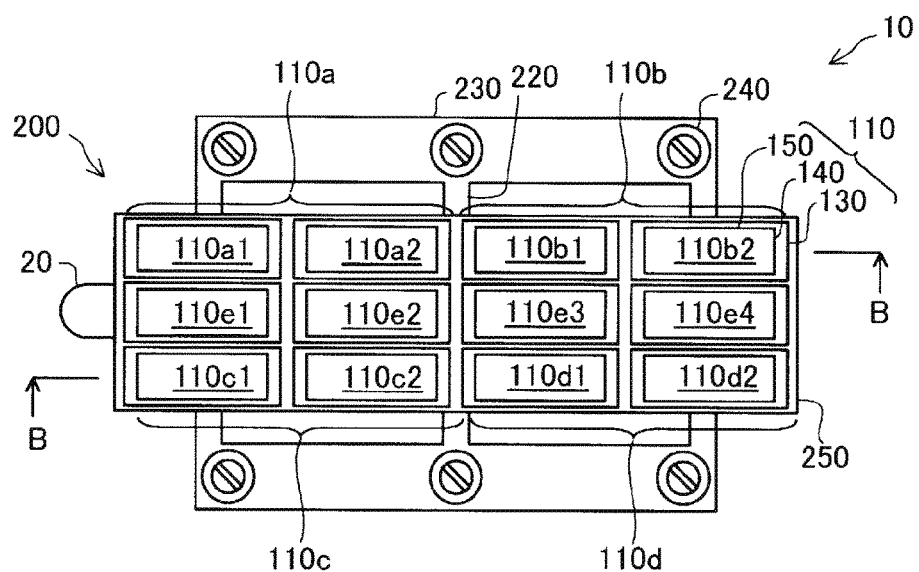
FIGS. 1A and 1B are respectively a plan view and a sectional view which illustrate a schematic configuration of a piezoelectric drive device according to a first embodiment.
Figure 1B:
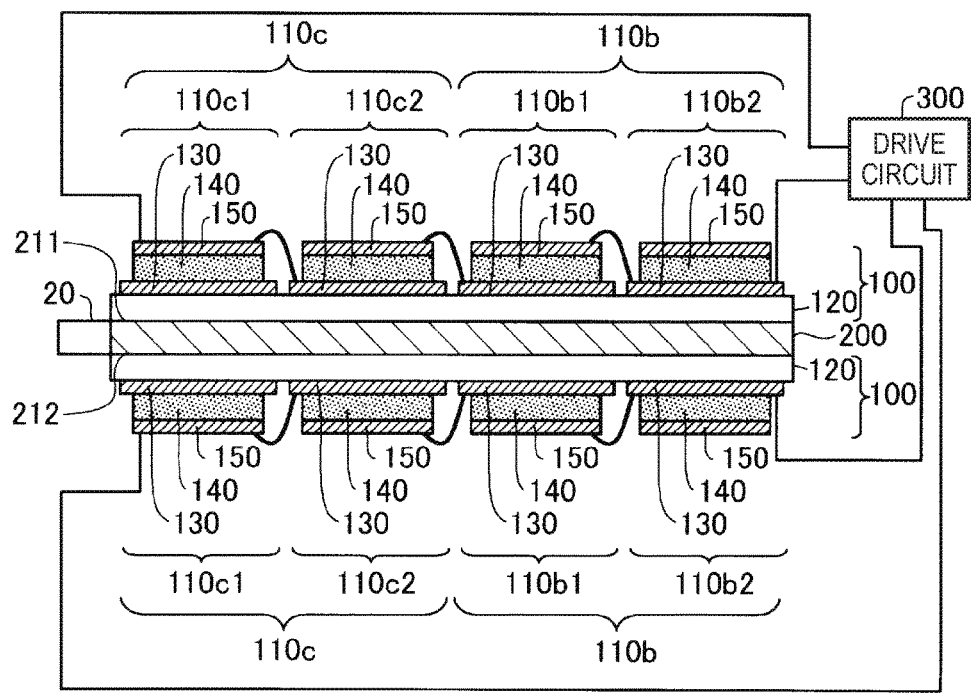

FIG. 1A is a plan view illustrating a schematic configuration of a piezoelectric drive device 10 according to a first embodiment of the invention. FIG. 1B is a sectional view taken along line B-B in FIG. 1A. The piezoelectric drive device 10 includes a vibrating plate 200 and two piezoelectric vibrating bodies 100 which are respectively arranged on both surfaces (first surface 211 and second surface 212) of the vibrating plate 200. The two piezoelectric vibrating bodies 100 are arranged symmetrical to each other around the vibrating plate 200. The two piezoelectric vibrating bodies 100 have the same configuration as each other. Thus, unless otherwise specified in the following, a configuration of the piezoelectric vibrating body 100 located on an upper side of the vibrating plate 200 will be described.

The piezoelectric vibrating body 100 includes a substrate 120 and multiple piezoelectric elements 110$a$1, 110$a$2, 110$b$1, 110$b$2, 110$c$1, 110$c$2, 110$d$1, 110$d$2, 110$e$1, 110$e$2, 110$e$3, and 110$e$4 which are formed on the substrate 120. The respective piezoelectric elements have the same structure as each other. Thus, if it is not necessary to distinguish one from another, the piezoelectric element is referred to as a "piezoelectric element 110".

The piezoelectric element 110 includes a first electrode 130, a piezoelectric substance 140 which is formed on the first electrode 130, and a second electrode 150 which is formed on the piezoelectric substance 140. The first electrode 130 and the second electrode 150 interpose the piezoelectric substance 140 therebetween. The piezoelectric element 110 can be formed by dividing one large piezoelectric element having one continuous piezoelectric substance and two continuous conductive layers (first electrode and second electrode) interposing the piezoelectric substance therebetween, into multiple pieces (into multiple piezoelectric elements) through a physical or chemical method such as ion milling and dry etching. The piezoelectric elements 110$e$1 to 110$e$4 are formed in a substantially rectangular shape, and are formed along a longitudinal direction of the substrate 120 at the center in a width direction of the substrate 120. The piezoelectric elements 110$a$1 and 110$a$2 are arrayed side by side along the longitudinal direction so as to form a piezoelectric element group 110$a$. Similarly, the piezoelectric elements 110$b$1 and 110$b$2, 110$c$1 and 110$c$2, and 110$d$1 and 110$d$2 respectively form piezoelectric element groups 110$b$, 110$c$, and 110$d$. The piezoelectric element groups 110$a$, 110$b$, 110$c$, and 110$d$ are formed at positions of four corners of the substrate 120.

The substrate 120 of the piezoelectric vibrating body 100 is used as a substrate for forming the first electrode 130, the piezoelectric substance 140, and the second electrode 150 through a film forming process. The substrate 120 also has a function as a vibrating plate for mechanical vibrating. For example, the substrate 120 can be formed of Si, $Al_2O_3$, and $ZrO_2$. For example, as the substrate 120 made of Si (hereinafter, also referred to as a "silicon substrate 120"), it is possible to use a Si wafer for semiconductor manufacturing. According to the embodiment, a planar shape of the substrate 120 is rectangular. For example, preferably, the thickness of the substrate 120 is set to a range of 10 μm to 100 μm. If the thickness of the substrate 120 is set to 10 μm or greater, the substrate 120 can be relatively easily handled when the film forming process on the substrate 120 is performed. If the thickness of the substrate 120 is set to 50 μm or greater, the substrate 120 can be more easily handled. If the thickness of the substrate 120 is set to 100 μm or smaller, the substrate 120 can be easily vibrated in response to expansion or contraction of the piezoelectric substance formed of a thin film.

As described above, the first electrode or the second electrode before being divided is a thin film formed by means of sputtering, for example. As a material of the first electrode or the second electrode, for example, it is possible to use any highly conductive material such as Aluminum (Al), nickel (Ni), gold (Au), platinum (Pt), and iridium (Ir). Wiring (or a wiring layer and an insulating layer) for electrical connection among the first electrode 130, the second electrode 150, and a drive circuit are omitted in the illustration in FIGS. 1A and 1B.

For example, the piezoelectric substance before being divided is formed using a sol-gel method or a sputtering method, and has a thin film shape. As a material of the piezoelectric substance, it is possible to use any material which shows a piezoelectric effect, such as ceramics employing a Perovskite structure of $ABO_3$ type. For example, as the ceramics employing the Perovskite structure of $ABO_3$ type, it is possible to use lead zirconate titanate (PZT), barium titanate, lead titanate, potassium niobate, lithium niobate, lithium tantalate, sodium tungstate, zinc oxide, barium strontium titanate (BST), strontium bismuth tantalate (SBT), lead metaniobate, lead zinc niobate, scandium lead niobate, and the like. For example, in addition to the ceramic, it is also possible to use a material which shows a piezoelectric effect, such as polyvinylidene fluoride, a crystal, and the like. For example, preferably, the thickness of the piezoelectric substance is set to a range of 50 nm (0.05 μm) to 20 μm. A thin film of the piezoelectric substance having the thickness in this range can be easily formed using a thin film forming process. If the thickness of the piezoelectric substance is set to 0.05 μm or greater, a sufficiently strong force can be generated in response to expansion or contraction of the piezoelectric substance. If the thickness of the piezoelectric substance is set to 20 μm or smaller, the piezoelectric drive device 10 can be sufficiently miniaturized.

Figure 2:
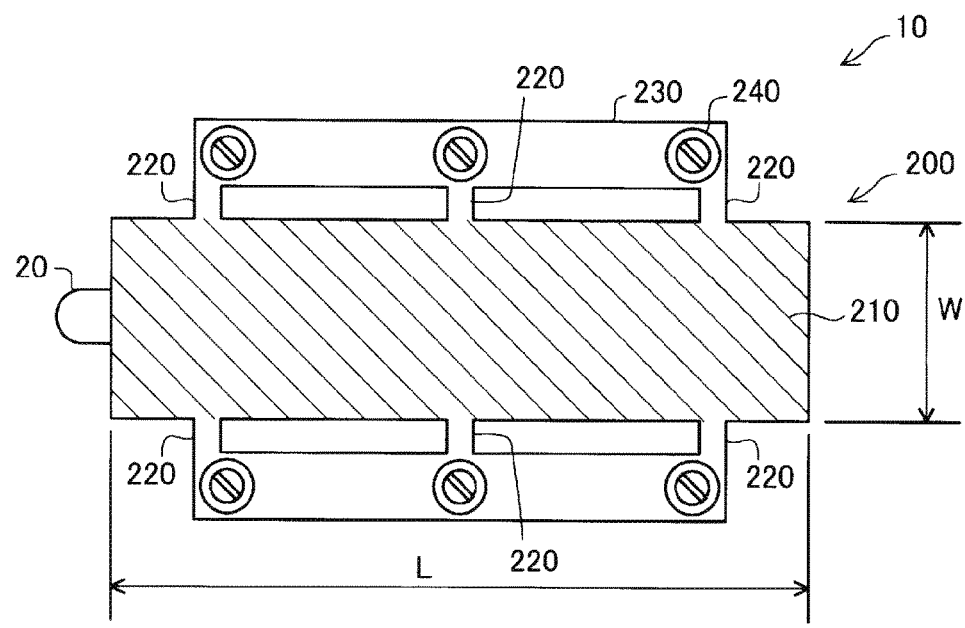
FIG. 2 is a plan view of a vibrating plate.

FIG. 2 is a plan view of the vibrating plate 200. The vibrating plate 200 has a rectangular vibrating body portion 210, and connection portions 220 which respectively triply extend from the right and left long sides of the vibrating body portion 210. In addition, the vibrating plate 200 has two attachment portions 230 which are respectively connected to the three connection portions 220 on the right and left sides. In FIG. 2, for convenience of illustration, the vibrating body portion 210 is hatched. The attachment portion 230 is used in order to attach the piezoelectric drive device 10 to other members by using a screw 240. For example, the vibrating plate 200 can be formed of metal such as silicon, silicon compound, stainless steel, aluminum, aluminum alloy, titanium, titanium alloy, copper, copper alloy, iron-nickel alloy, and the like, metal oxide, or materials such as diamond and the like.

The piezoelectric vibrating bodies 100 (refer to FIGS. 1A and 1B) respectively adhere to an upper surface (first surface) and a lower surface (second surface) of the vibrating body portion 210 by using an adhesive. Preferably, a ratio between a length L and a width W of the vibrating body portion 210 is set to L:W=approximately 7:2. The ratio is a preferred value used in order to perform ultrasonic vibrations (to be described later) by which the vibrating body portion 210 is bent to the right and left along its plane. For example, the length L of the vibrating body portion 210 can be set to a range of 0.1 mm to 30 mm. For example, the width W can be set to a range of 0.05 mm to 8 mm. Preferably, the length L is set to 50 mm or smaller in order for the vibrating body portion 210 to perform the ultrasonic vibrations. For example, the thickness (thickness of the vibrating plate 200) of the vibrating body portion 210 can be set to a range of 20 μm to 700 μm. If the thickness of the vibrating body portion 210 is set to 20 μm or greater, the vibrating body portion 210 has sufficient rigidity in order to support the piezoelectric vibrating body 100. If the thickness of the vibrating body portion 210 is set to 700 μm or smaller, the vibrating body portion 210 is enabled to have sufficiently large deformation in response to deformation of the piezoelectric vibrating body 100.

A protrusion portion 20 (also referred to as a "contact portion" or an "operation portion") is disposed on one short side of the vibrating plate 200. The protrusion portion 20 can come into contact with a driven body so as to apply force to the driven body. Preferably, the protrusion portion 20 is formed of a durable material such as ceramics (for example, $Al_2O_3$).

Figure 3:
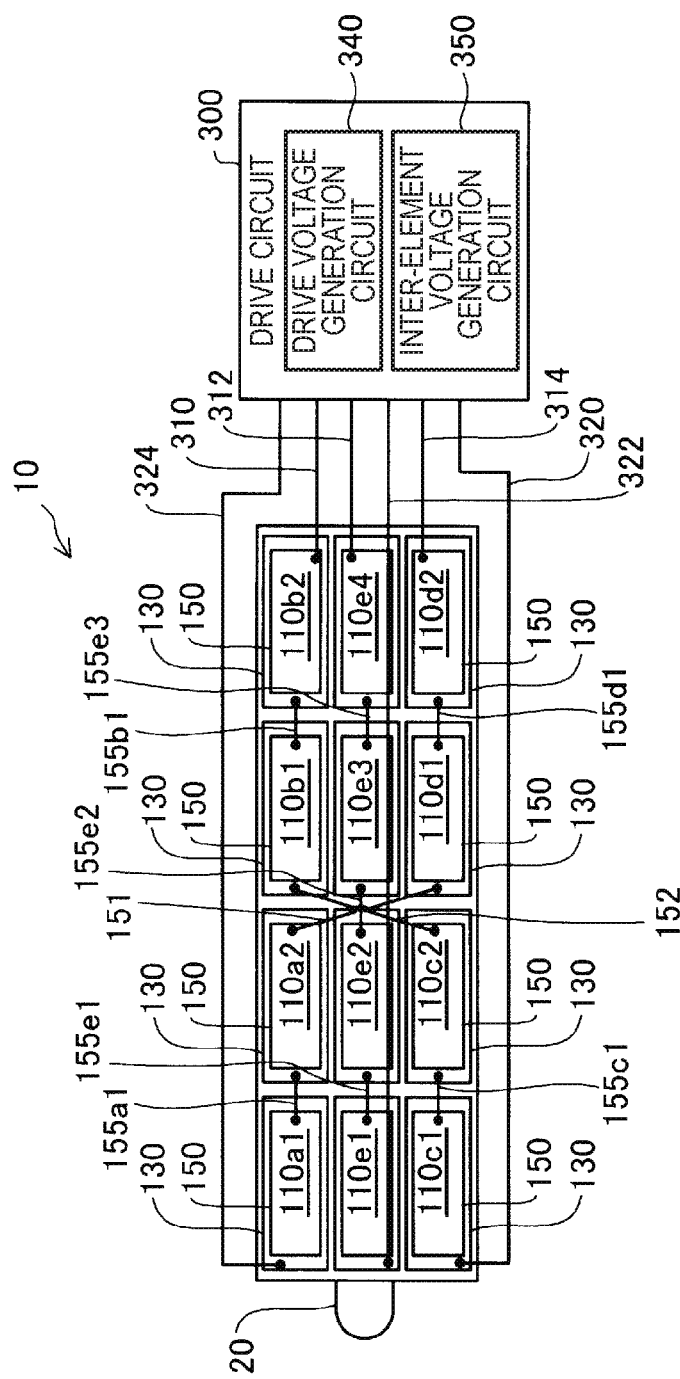
FIG. 3 is a view for describing an electrical connection state between the piezoelectric drive device and a drive circuit.

FIG. 3 is a view for describing an electrical connection state between the piezoelectric drive device 10 and a drive circuit 300. The drive circuit 300 includes a drive voltage generation circuit 340 and an inter-element voltage generation circuit 350. The drive voltage generation circuit 340 generates a drive voltage including an AC component. Preferably, as the drive voltage, the drive voltage generation circuit 340 is configured to be capable of generating at least any one of an AC drive voltage including only the AC component varying between a positive side and a negative side with respect to ground potential and an offset-provided drive voltage including the AC component and a DC offset (DC component). Preferably, the AC component of the drive voltage is a voltage signal having a frequency close to a mechanical resonance frequency of the piezoelectric drive device 10. A waveform of the AC component is typically a sine wave, but may have a waveform other than the sine wave. The DC component is not necessarily strictly constant, and may vary to a certain degree. For example, the DC component may vary within ±10% of the average value.

Figure 4A:
FIGS. 4A to 4C are views for describing a waveform example of an AC component of a drive voltage.
Figure 4B:
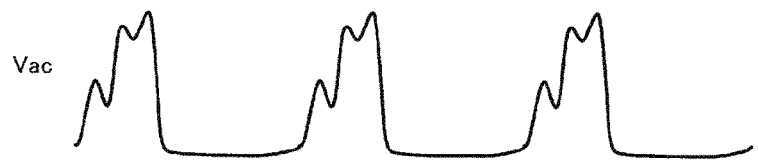
Figure 4C:
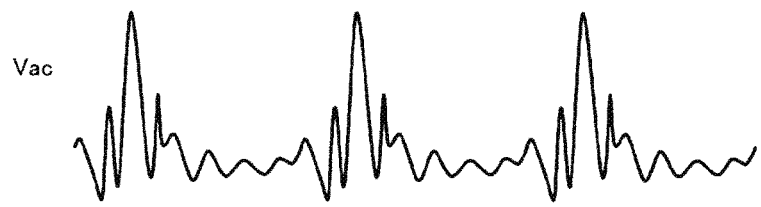

FIGS. 4A to 4C illustrate a waveform example of an AC component Vac of the drive voltage. The AC component Vac in FIG. 4A is the sine wave. The AC component Vac in FIGS. 4B and 4C is not the sine wave, but has a cyclical waveform. As can be understood from these examples, as long as the AC component Vac of the drive voltage is cyclical, various types of waveforms can be employed.

The inter-element voltage generation circuit 350 supplies an inter-element voltage to a piezoelectric element array, and a specific example thereof will be described later. FIG. 3 omits the illustration of a connection state among the drive voltage generation circuit 340, the inter-element voltage generation circuit 350, and the piezoelectric element, but a connection relationship therebetween will be described later. The drive voltage generation circuit 340 is also referred to as a "first generation circuit" or a "first voltage generation circuit", and the inter-element voltage generation circuit 350 is also referred to as a "second generation circuit" or a "second voltage generation circuit".

According to the embodiment, the piezoelectric element is divided into three groups which respectively have four piezoelectric elements. The first group has the piezoelectric elements 110c1, 110c2, 110b1, and 110b2. The second group has the piezoelectric elements 110a1, 110a2, 110d1, and 110d2. The third group has the piezoelectric elements 110e1, 110e2, 110e3, and 110e4.

The piezoelectric elements 110c1, 110c2, 110b1, and 110b2 in the first group are connected in series as follows. That is, the drive circuit 300 and the first electrode 130 of the first piezoelectric element 110c1 are connected to each other by a wire 320. The second electrode 150 of the first piezoelectric element 110c1 and the first electrode 130 of the second piezoelectric element 110c2 are connected to each other by a wire 155c1. The second electrode 150 of the second piezoelectric element 110c2 and the first electrode 130 of the third piezoelectric element 110b1 are connected to each other by a wire 152. The second electrode 150 of the third piezoelectric element 110b1 and the first electrode 130 of the fourth piezoelectric element 110b2 are connected to each other by a wire 155b1. The second electrode 150 of the fourth piezoelectric element 110b2 and the drive circuit 300 are connected to each other by a wire 310. The piezoelectric elements 110c1, 110c2, 110b1, and 110b2 are connected in series by these wires.

Similarly, the piezoelectric elements 110a1, 110a2, 110d1, and 110d2 in the second group are also connected in series as follows. The drive circuit 300 and the first electrode 130 of the first piezoelectric element 110a1 are connected to each other by a wire 324. The second electrode 150 of the first piezoelectric element 110a1 and the first electrode 130 of the second piezoelectric element 110a2 are connected to each other by a wire 155a1. The second electrode 150 of the second piezoelectric element 110a2 and the first electrode 130 of the third piezoelectric element 110d1 are connected to each other by a wire 151. The second electrode 150 of the fourth piezoelectric element 110d1 and the first electrode 130 of the fourth piezoelectric element 110d2 are connected to each other by a wire 155d1. The second electrode 150 of the fourth piezoelectric element 110d2 and the drive circuit 300 are connected to each other by a wire 314. The piezoelectric elements 110a1, 110a2, 110d1, and 110d2 are connected in series by these wires.

The piezoelectric elements 110e1, 110e2, 110e3, and 110e4 in the third group are connected in series as follows. The drive circuit 300 and the first electrode 130 of the first piezoelectric element 110e1 are connected to each other by a wire 322. The second electrode 150 of the first piezoelectric element 110e1 and the first electrode 130 of the second piezoelectric element 110e2 are connected to each other by a wire 155e1. The second electrode 150 of the second piezoelectric element 110e2 and the first electrode 130 of the third piezoelectric element 110e3 are connected to each other by a wire 155e2. The second electrode 150 of the third piezoelectric element 110e3 and the first electrode 130 of the fourth piezoelectric element 110e4 are connected to each other by a wire 155e3. The second electrode 150 of the fourth piezoelectric element 110e4 and the drive circuit 300 are connected to each other by a wire 312. The piezoelectric elements 110e1, 110e2, 110e3, and 110e4 are connected in series by these wires.

These wires 151, 152, and 155a1 to 155e3 may be formed through a film forming process, or may be implemented by means of wire-shaped wiring. The drive circuit 300 applies the drive voltage including the cyclically varying AC component between the wire 314 and the wire 324, thereby causing the piezoelectric drive device 10 to perform ultrasonic vibrations. In this manner, a rotor (driven body) which comes into contact with the protrusion portion 20 can be rotated in a predetermined rotation direction. The drive circuit 300 applies the drive voltage including the AC component between the wire 310 and the wire 320, thereby enabling the rotor which comes into contact with the protrusion portion 20 to be rotated in the opposite direction. The voltage is simultaneously applied to the two piezoelectric vibrating bodies 100 respectively disposed on both surfaces of the vibrating plate 200. Wiring (or a wiring layer and an insulating layer) configuring the wires 151, 152, 155a1 to 155e3, 310, 312, 314, 320, 322, and 324 illustrated in FIG. 3 are omitted in the illustration in FIGS. 1A and 1B.

According to the embodiment, the following effects decrease an electrostatic capacity of the piezoelectric drive device 10 when viewed from the drive circuit 300.

(1) Effect of Area: Each area of the first electrode 130 and the second electrode 150 in the piezoelectric element 110 according to the embodiment is half compared to each area of the first electrode and the second electrode in the piezoelectric element illustrated in FIG. 7 in the related art (JP-A-2004-320979). The electrostatic capacity is proportional to an area of the electrode. Accordingly, the electrostatic capacity of the piezoelectric element becomes one second.

(2) Effect of Series Connection: In general, if the N number (N is an integer of two or more) of capacity elements having the same electrostatic capacity C are connected in series, the total electrostatic capacities shows C/N.

According to the embodiment, four piezoelectric elements of substantially the same type are connected in series. Accordingly, a synthetic electrostatic capacity shows C/4. In contrast, if the N number (N is an integer of two or more) of capacity elements having the same electrostatic capacity C are connected in parallel, the synthetic electrostatic capacity shows N×C. According to the related art, since two piezoelectric elements are connected in parallel, the synthetic electrostatic capacity shows 2C. Compared to the related art, the synthetic electrostatic capacity of the piezoelectric elements according to the embodiment is one eighth. According to these two effects, if the synthetic electrostatic capacity of the piezoelectric elements in the related art is assumed to be one, the synthetic electrostatic capacity of the four piezoelectric elements connected in series is one sixteenth. As described above, the piezoelectric element is divided into the multiple piezoelectric elements, and the multiple piezoelectric elements are connected in series. In this manner, it is possible to decrease the electrostatic capacity.

Figure 5:
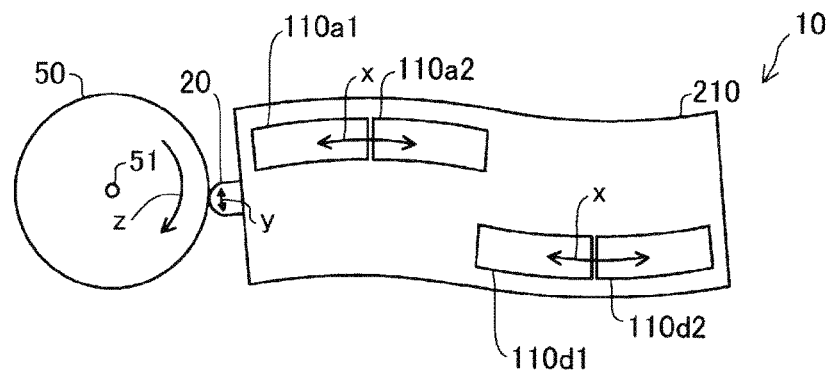
FIG. 5 is a view for describing an operation example of the piezoelectric drive device.

FIG. 5 is a view for describing an operation example of the piezoelectric drive device 10. The protrusion portion 20 of the piezoelectric drive device 10 is in contact with an outer periphery of a rotor 50. In the example illustrated in FIG. 5, the drive circuit 300 (refer to FIG. 3) applies the drive voltage including the AC component to the four piezoelectric elements 110a1, 110a2, 110d1, and 110d2 connected in series. The piezoelectric elements 110a', 110a2, 110d1, and 110d2 expand and contract in a direction of an arrow x in FIG. 5. In response to this, the vibrating body portion 210 of the piezoelectric drive device 10 is deformed into a meandering shape (S-shape) which is bent inside a plane of the vibrating body portion 210. A distal end of the protrusion portion 20 performs reciprocating movement or elliptical movement in a direction of an arrow y. As a result, the rotor 50 is rotated around a center 51 thereof in a predetermined direction z (clockwise direction in FIG. 5). The three connection portions 220 (refer to FIG. 2) of the vibrating plate 200 described with reference to FIG. 2 are disposed at a position of a vibration knot (joint) of the vibrating body portion 210 described above. When the drive circuit 300 applies the drive voltage including the AC component to the other four piezoelectric elements 110c1, 110c2, 110b1, and 110b2, the rotor 50 is rotated in the opposite direction. If the drive voltage including the AC component is applied to the four piezoelectric elements 110e1, 110e2, 110e3, and 110e4 in the center, the piezoelectric drive device 10 expands or contracts in the longitudinal direction. Accordingly, it is possible to increase force applied from the protrusion portion 20 to the rotor 50. This operation of the piezoelectric drive device 10 (or the piezoelectric vibrating body 100) is disclosed in JP-A-2004-320979 or corresponding U.S. Pat. No. 7,224,102, the content of which is incorporated by reference.

Figure 6A:
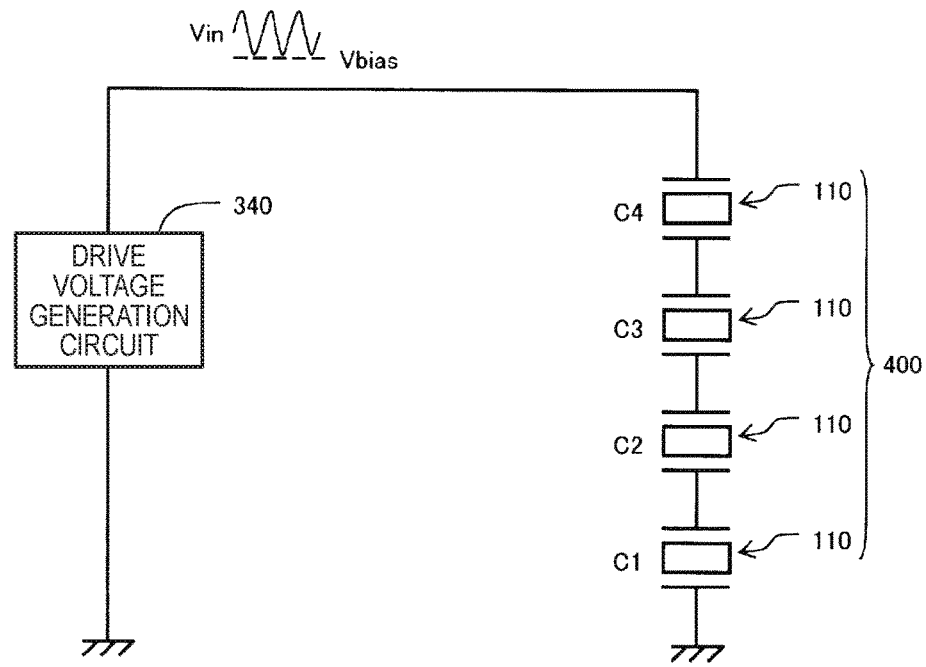
FIGS. 6A and 6B are views for describing a configuration of a piezoelectric element drive circuit according to a comparative example and the first embodiment.
Figure 6B:
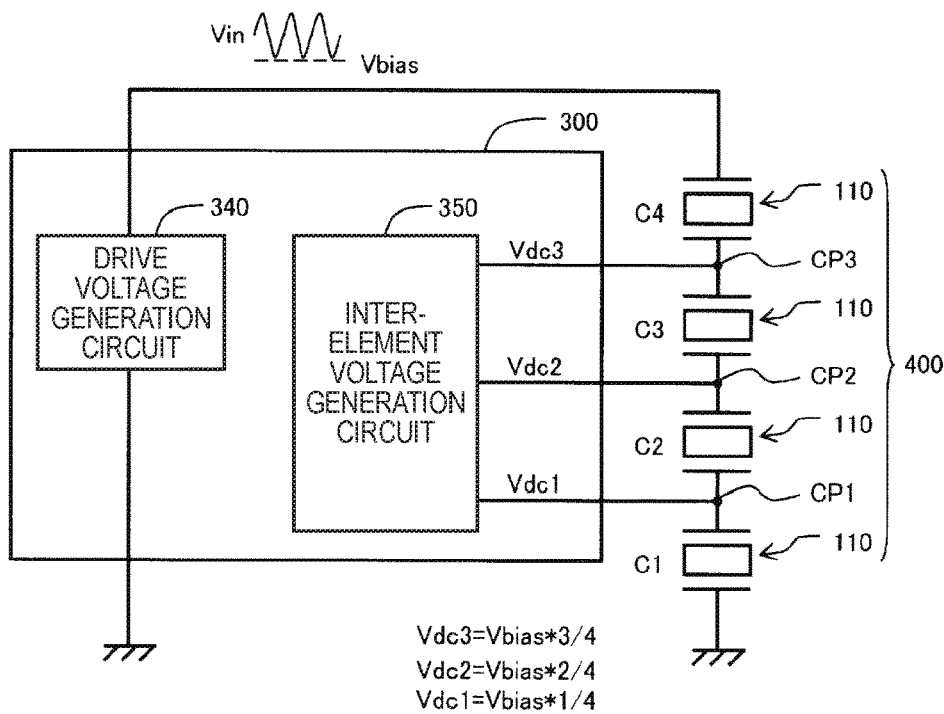

Various Embodiments of Piezoelectric Element Drive Circuit:

FIGS. 6A and 6B are views for describing a configuration of a piezoelectric element drive circuit according to a comparative example and a first embodiment. The piezoelectric element drive circuit according to the comparative example illustrated in FIG. 6A is configured to include the drive voltage generation circuit 340 and a piezoelectric element array 400 connected to the drive voltage generation circuit 340. The drive voltage generation circuit 340 supplies a drive voltage Vin including an AC component and a DC component Vbias to the piezoelectric element array 400. The piezoelectric element array 400 is configured so that the multiple piezoelectric elements 110 are connected in series. In the example illustrated in FIG. 6A, the piezoelectric element array 400 is configured to include the four piezoelectric elements 110. However, the piezoelectric element array 400 can be configured so that the N (N is an integer of two or more) number of piezoelectric elements 110 are connected in series. In view of a relationship with FIGS. 1A, 1B, and 3 described above, for example, the piezoelectric element array 400 in FIG. 6A corresponds to the piezoelectric elements 110a1, 110a2, 110d1, and 110d2 in the first group which are connected in series in FIG. 3. The four piezoelectric elements 110 are equivalent to capacitors having electrostatic capacities C1 to C4. The electrostatic capacities C1 to C4 may have values different from each other, but preferably have the same value as each other. Hereinafter, a case will be mainly described in which the electrostatic capacities C1 to C4 of the multiple piezoelectric elements 110 are the same as each other.

In the comparative example in FIG. 6A, it is ideal that the AC component and the DC component Vbias of the drive voltage Vin are respectively divided by the multiple piezoelectric elements 110 configuring the piezoelectric element array 400. However, the AC component is almost ideally divided by the multiple piezoelectric elements 110, but the DC component Vbias is not ideally divided in some cases. For example, there is a possibility that most of the DC component Vbias may be applied to one piezoelectric element 110 within the multiple piezoelectric elements 110 configuring the piezoelectric element array 400. Various embodiments described below are intended to solve or mitigate this problem.

The piezoelectric element drive circuit according to the first embodiment illustrated in FIG. 6B has an inter-element voltage generation circuit 350 in addition to the drive voltage generation circuit 340 and the piezoelectric element array 400. The inter-element voltage generation circuit 350 supplies each of inter-element voltages Vdc1 to Vdc3 having respectively different voltage values to three connection points CP1 to CP3 between the four piezoelectric elements 110. The drive voltage generation circuit 340 supplies the drive voltage Vin including the AC component and the DC component Vbias to the piezoelectric element array 400.

Preferably, the inter-element voltages Vdc1 to Vdc3 are set to respectively have values obtained by dividing the DC component Vbias of the drive voltage Vin as follows.

$$Vdc1 = Vbias \times 1/4 \tag{1a}$$

$$Vdc2 = Vbias \times 2/4 \tag{1b}$$

$$Vdc3 = Vbias \times 3/4 \tag{1c}$$

If the inter-element voltages Vdc1 to Vdc3 are set in this way, the voltage in the connection points CP1 to CP3 between the adjacent piezoelectric elements 110 is adjusted by these inter-element voltages Vdc1 to Vdc3. Accordingly, it is possible to solve or mitigate the problem in the above-described comparative example (most of the DC component Vbias are applied to one piezoelectric element 110 within the multiple piezoelectric elements 110). That is, according to the circuit configuration in the first embodiment, it is possible to prevent a phenomenon in which an excessive voltage is applied to some piezoelectric elements 110 within the piezoelectric elements 110 connected in series. Accordingly, it is possible to decrease an effective electrostatic capacity of the whole piezoelectric elements 110, thereby enabling power consumption to decrease. In particular, in a case of a thin film piezoelectric element 110 in which the thickness of the piezoelectric substance 140 is 0.05 μm to 20 μm, the electrostatic capacity is larger than that of a thick film (bulky) piezoelectric element. However, the inter-element voltage generation circuit 350 can decrease the power consumption of the whole drive circuit 300. As the offset-provided drive voltage Vin including the AC component and the DC component (DC offset), it is preferable to use a pulsating voltage whose voltage value is always positive or negative. If this pulsating voltage is used as the drive voltage Vin, it is possible to further decrease a drive current.

Incidentally, the electrostatic capacities C1 to C4 of the multiple piezoelectric elements 110 are not the same as each other, it is preferable to set the inter-element voltages Vdc1 to Vdc3 so that a voltage difference between both ends of the respective piezoelectric elements 110 is a value obtained by dividing the DC component Vbias of the drive voltage Vin in accordance with the electrostatic capacities C1 to C4 of the multiple piezoelectric elements 110. This setting is also applied to a case where the electrostatic capacities C1 to C4 of the multiple piezoelectric elements 110 are the same as each other. That is, in general, in order for the voltage difference between both ends of the respective piezoelectric elements 110 within the N (N is an integer of two or more) number of piezoelectric elements 110 configuring the piezoelectric element array 400 to be a value obtained by dividing the DC component Vbias of the drive voltage Vin in accordance with the electrostatic capacity of the respective piezoelectric elements 110, it is preferable to set the inter-element voltage supplied to the (N−1) number of connection points. In this case, the voltage difference between both ends of the respective piezoelectric elements is obtained by the following expression.

$$\Delta Vj = Vbias / \{ \Sigma(1/Ci) \times Cj \} \tag{2}$$

Here, $\Delta Vj$ represent a voltage difference between both ends of the $j^{th}$ (j=1 to N) piezoelectric element, $\Sigma(1/Ci)$ represents a sum of the reciprocal of an electrostatic capacity Ci (i=1 to N) of the N number of the piezoelectric elements, and Cj represents an electrostatic capacity of the $j^{th}$ piezoelectric element.

In Expression (2) above, if N=4 is set and Cj (j=1 to 4) is assumed to be constant regardless of j, all of $\Delta Vj$ are the same as Vbias/4. It can be understood that the result is consistent with Expressions (1a) to (1c) above. However, even when electrostatic capacities Cj of the multiple piezoelectric elements 110 are not the same as each other, the inter-element voltage may be determined so as to satisfy Expressions (1a) to (1c) above. Even in this case, it is practically sufficient in a sense of stabilizing an operation of the piezoelectric elements 110.

The voltage difference $\Delta Vj$ between both ends of the respective piezoelectric elements 110 provided with the inter-element voltages Vdc1 to Vdc3 may not necessarily satisfy Expression (2) above, and may have a slightly offset value. However, preferably, the voltage difference $\Delta Vj$ between both ends of the respective piezoelectric elements 110 has a value within a range of 100±10%, when the value obtained by Expression (2) above is set to 100%.

As described above, according to the piezoelectric element drive circuit in the first embodiment illustrated in FIG. 6B, the inter-element voltages Vdc1 to Vdc3 serving as the DC voltage are respectively applied to the connection points CP1 to CP3 between the two adjacent piezoelectric elements 110 within the piezoelectric element array 400. Accordingly, it is possible to prevent a phenomenon in which an excessive voltage is applied to some piezoelectric elements 110 within the piezoelectric elements 110 connected in series. As a result, it is possible to decrease an effective electrostatic capacity of the whole piezoelectric elements 110, thereby enabling power consumption to decrease.

According to the first embodiment, the inter-element voltages Vdc1 to Vdc3 are respectively applied to all of the three connection points CP1 to CP3 between the four piezoelectric elements 110. However, the inter-element voltage generation circuit 350 may supply the inter-element voltage to at least one of the multiple connection points CP1 to CP3. That is, in general, the inter-element voltage generation circuit 350 may supply each inter-element voltage including the DC component to the M number (M is an integer of one or more and less than the N number) of connection points within the (N−1) number of connection points between the two adjacent piezoelectric elements 110 within the piezoelectric element array 400 configured to include the N number of piezoelectric elements 110. Even in this case, compared to a case where the inter-element voltage is not supplied at all, the DC component Vbias of the drive voltage Vin is more stably distributed to the multiple piezoelectric elements 110. Accordingly, it is possible to suppress a phenomenon in which an excessive voltage is applied to some piezoelectric elements 110 within the piezoelectric elements 110 connected in series. This point is similarly applied to other embodiments to be described later.

As the offset-provided drive voltage including the AC component and the DC component (DC offset), it is preferable to use a pulsating voltage whose voltage value is always positive or negative. If this pulsating voltage is used, it is possible to further decrease a drive current.

Figure 7:
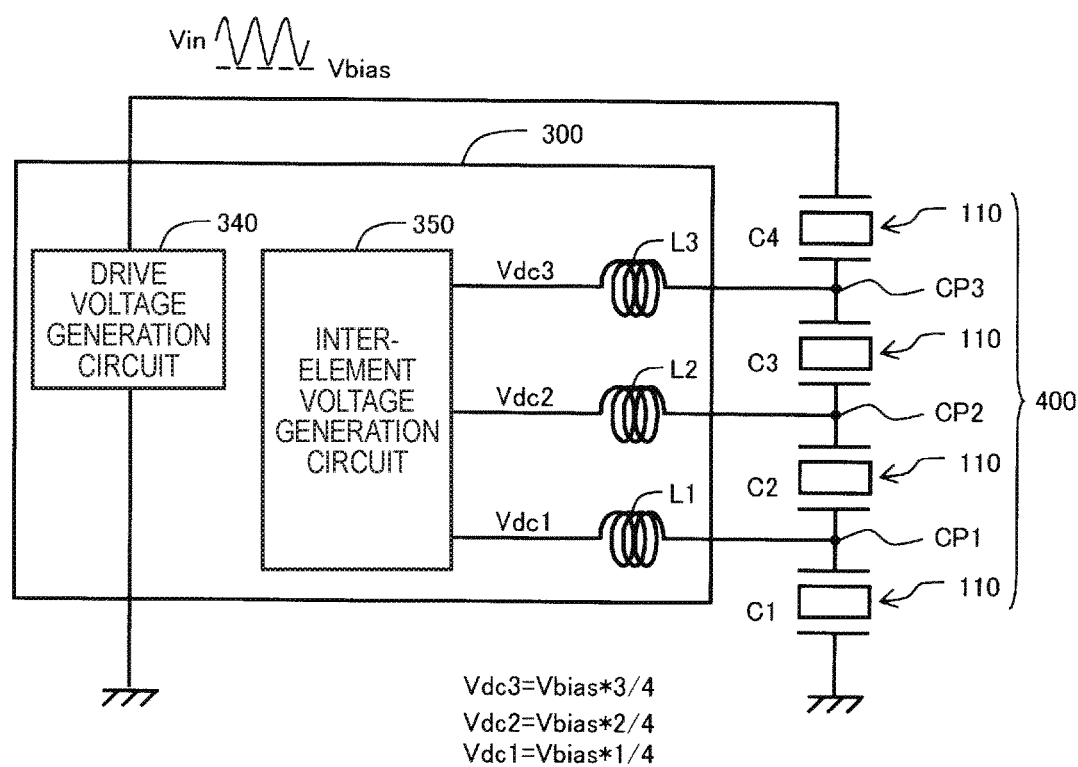
FIG. 7 is a view for describing a configuration of a piezoelectric element drive circuit according to a second embodiment.

FIG. 7 is a view for describing a configuration of a piezoelectric element drive circuit according to a second embodiment. The piezoelectric element drive circuit according to the second embodiment is configured so that inductors L1, L2, and L3 are added to the circuit according to the first embodiment illustrated in FIG. 6B. The inductors L1, L2, and L3 are respectively connected between the inter-element voltage generation circuit 350 and the connection points CP1, CP2, and CP3 with the adjacent piezoelectric elements 110. Hereinafter, the same reference numerals L1, L2, and L3 as those of the inductors will be used for inductance of the inductors L1, L2, and L3.

The reason for disposing the inductors L1, L2, and L3 is to control a phenomenon in which the AC component of the drive voltage Vin reversely flows into the inter-element voltage generation circuit 350. In order to achieve this effect, preferably, the inductors L1, L2, and L3 satisfy at least one of the following two conditions.

Condition 1
Impedance ($=2\pi f \cdot Lj$) of each inductance Lj is 1 kΩ or greater (here, f is a frequency of the AC component of the drive voltage Vin)

Condition 2
Impedance ($=2\pi f \cdot Lj$) of each inductance Lj is 10 or more times the impedance ($=1/(2\pi f \cdot Cmin)$) corresponding to the minimum value Cmin within the electrostatic capacity Ci of the multiple piezoelectric elements 110 configuring the piezoelectric element array 400

Condition 1 above is used in order to decrease a current value, when the AC component of the drive voltage Vin reversely flows into the inter-element voltage generation circuit 350 from the piezoelectric element array 400. Condition 2 above is used in order to prevent a current from reversely flowing into the inter-element voltage generation circuit 350 due to fluctuations in the voltage difference between both ends of the respective piezoelectric elements 110. Preferably, the respective inductances L1, L2, and L3 satisfy at least anyone of Conditions 1 and 2 above, but more preferably satisfy both of them. In this case, the inductances L1, L2, and L3 can decrease the AC component of the drive voltage which reversely flows into the drive circuit via the connection points CP1 to CP3 to which the inter-element voltage is supplied.

Figure 8:
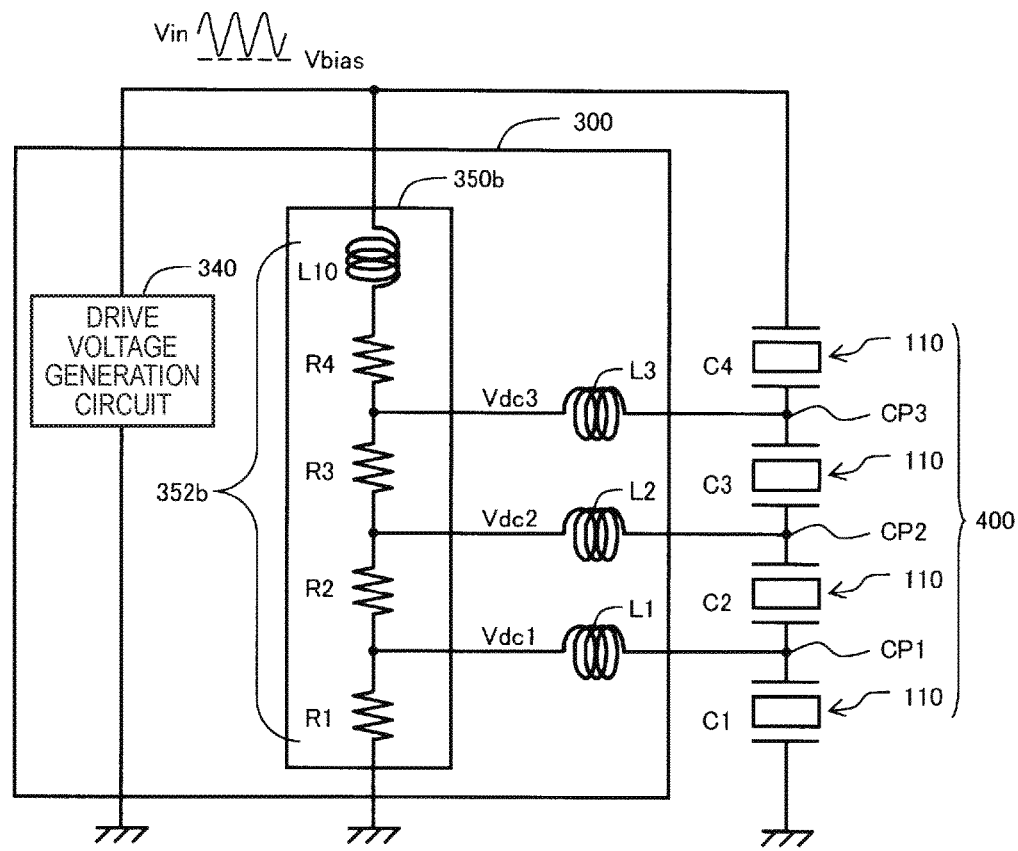
FIG. 8 is a view for describing a configuration of a piezoelectric element drive circuit according to a third embodiment.

FIG. 8 is a view for describing a configuration of a piezoelectric element drive circuit according to a third embodiment. The piezoelectric element drive circuit according to the third embodiment is different from that according to the second embodiment illustrated in FIG. 7 in that an internal configuration example of an inter-element voltage generation circuit 350b is described in detail. The other configurations are the same as those according to the second embodiment. The inter-element voltage generation circuit 350b is connected to an output terminal of the drive voltage Vin of the drive voltage generation circuit 340, and internally includes a voltage divider circuit 352b for dividing the drive voltage Vin. The voltage divider circuit 352b is configured so that the inductor L10 and multiple resistors R1 to R4 are connected in series.

The multiple resistors R1 to R4 are connected in series in order to respectively generate the inter-element voltages Vdc1 to Vdc3 by dividing the DC component Vbias included in the drive voltage Vin. However, in the example in FIG. 8, the drive voltage Vin includes the AC component in addition to the DC component Vbias. Accordingly, the inter-element voltages Vdc1 to Vdc3 do not become a DC voltage, and include the AC component. However, the inductors L1 to L3 connected to the connection points CP1 to CP3 of the piezoelectric element array 400 configure one type of smoothing circuit. Accordingly, the AC component included in the inter-element voltages Vdc1 to Vdc3 is smoothed by the smoothing circuits. Therefore, according to the third embodiment, it is also possible to further prevent a phenomenon in which an excessive voltage is applied to some piezoelectric elements 110 within the piezoelectric elements 110 connected in series. Thus, it is possible to decrease an effective electrostatic capacity of the whole piezoelectric elements, thereby enabling power consumption of the piezoelectric element drive circuit to decrease. The "inter-element voltage including the DC component" described herein includes the inter-element voltage including the DC component and the inter-element voltage including both the DC component and the AC component. However, preferably, the inter-element voltage including only the DC component is used in a sense of stabilizing a voltage between electrodes of the respective piezoelectric elements.

The inductor L10 inside the voltage divider circuit 352b is used in order to prevent the AC component of the drive voltage Vin from flowing to a ground side via the resistors R1 to R4. Preferably, the impedance ($=2\pi f \cdot L10$) of the inductor L10 is 1 kΩ or greater (here, f is a frequency of the AC component of the drive voltage Vin). In the example illustrated in FIG. 8, the inductor L10 is connected to a high voltage side of the multiple resistors R1 to R4. Alternatively, the inductor L10 may be connected to a ground wire side (that is, to a low voltage side of the resistors R1 to R4), or the inductor L10 may be omitted.

Figure 9:
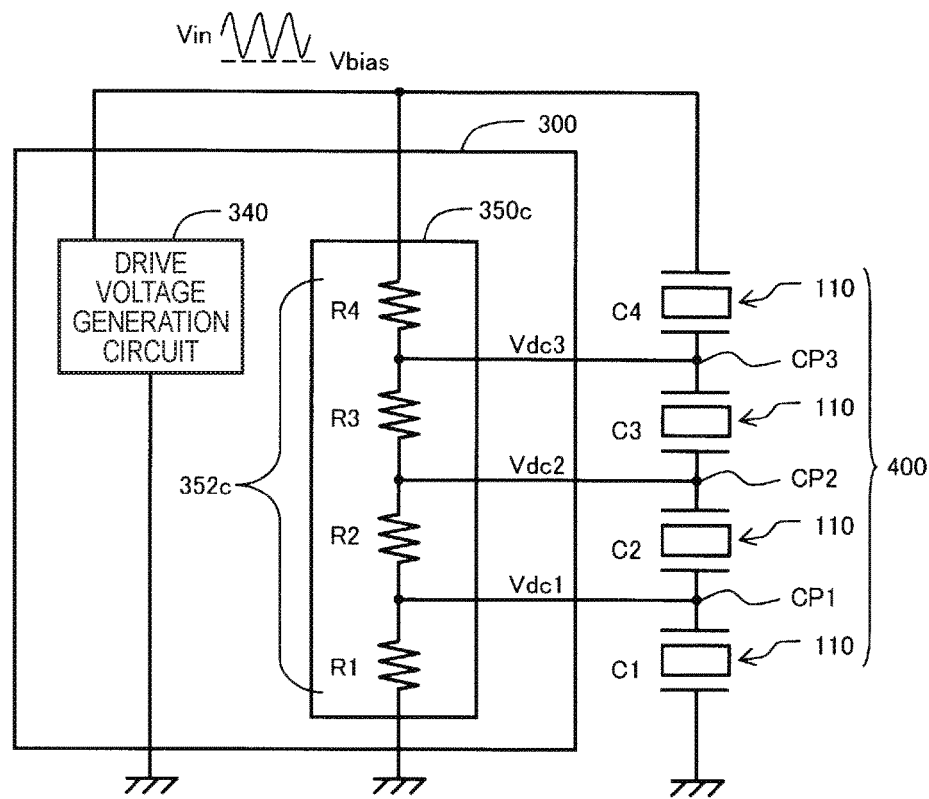
FIG. 9 is a view for describing a configuration of a piezoelectric element drive circuit according to a fourth embodiment.

FIG. 9 is a view for describing a configuration of a piezoelectric element drive circuit according to a fourth embodiment. The piezoelectric element drive circuit according to the fourth embodiment is different from that according to the third embodiment in that the inductors L1 to L3 and L10 according to the third embodiment illustrated in FIG. 8 are omitted. The other configurations are the same as those according to the third embodiment. An inter-element voltage generation circuit 350c is configured so that the multiple resistors R1 to R4 are connected in series, and includes a voltage divider circuit 352c. According to this configuration, as also described in FIG. 8, the inter-element voltages Vdc1 to Vdc3 do not have the DC voltage, and include the AC component. However, even when the inductors L1 to L3 illustrated in FIG. 8 are omitted, a voltage of the connection points CP1 to CP3 between the piezoelectric elements 110 is stabilized by the inter-element voltages Vdc1 to Vdc3. Accordingly, it is possible to further prevent a phenomenon in which an excessive voltage is applied to some piezoelectric elements 110 within the piezoelectric elements 110 connected in series. As a result, it is possible to decrease an effective electrostatic capacity of the whole piezoelectric elements, thereby enabling power consumption of the piezoelectric element drive circuit to decrease.

Figure 10:
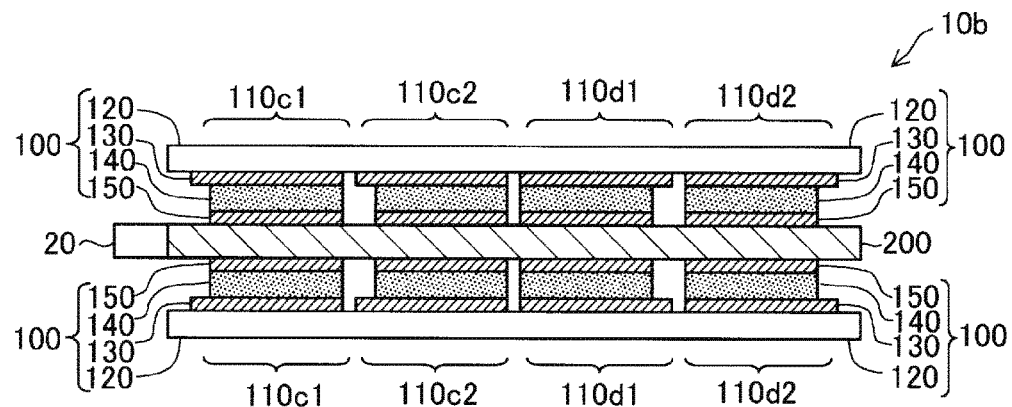
FIG. 10 is a sectional view of a piezoelectric drive device according to another embodiment.

Another Embodiment of Piezoelectric Drive Device:

FIG. 10 is a sectional view of a piezoelectric drive device 10b according to a fifth embodiment of the invention, and corresponds to FIG. 1B according to the first embodiment. In the piezoelectric drive device 10b, the piezoelectric vibrating body 100 is arranged in the vibrating plate 200 in a state where the piezoelectric vibrating body 100 is vertically inverted with respect to FIG. 1B. That is, an arrangement is made herein so that second electrodes 150c1, 150c2, 150d1, and 150d2 are close to the vibrating plate 200 and the substrate 120 is farthest from the vibrating plate 200. Similarly to FIG. 1B, FIG. 10 also omits the illustration of wiring (or a wiring layer and an insulating layer) for electrical connection between first electrodes 130a1, 130a2, 130b1, 130b2, 130c1, 130c2, 130d1, 130d2, 130e1, 130e2, 130e3, and 130e4, second electrodes 150a1, 150a2, 150b1, 150b2, 150c1, 150c2, 150d1, 150d2, 150e1, 150e2, 150e3, and 150e4, and a drive circuit. The piezoelectric drive device 10b can also achieve the same effect as that according to the first embodiment.

With regard to the configuration and the arrangement of the piezoelectric drive device or the piezoelectric element, any desired configuration and arrangement can be employed in addition to those illustrated in FIGS. 1A, 1B, 3, and 10.

Embodiment of Device Employing Piezoelectric Drive Device:

The above-described piezoelectric drive device 10 applies great force to the driven body by utilizing resonance, and can be applied to various devices. For example, the piezoelectric drive device 10 can be used as a drive device for various apparatuses such as a robot (also including an electronic component conveying apparatus (IC handler)), a medication pump, a timepiece calendar feeding device, a printing apparatus (for example, a sheet feeding mechanism. However, not applicable to a head since the vibrating plate is not caused to resonate in the piezoelectric drive device used for the head). Hereinafter, a representative embodiment will be described.

Figure 11:
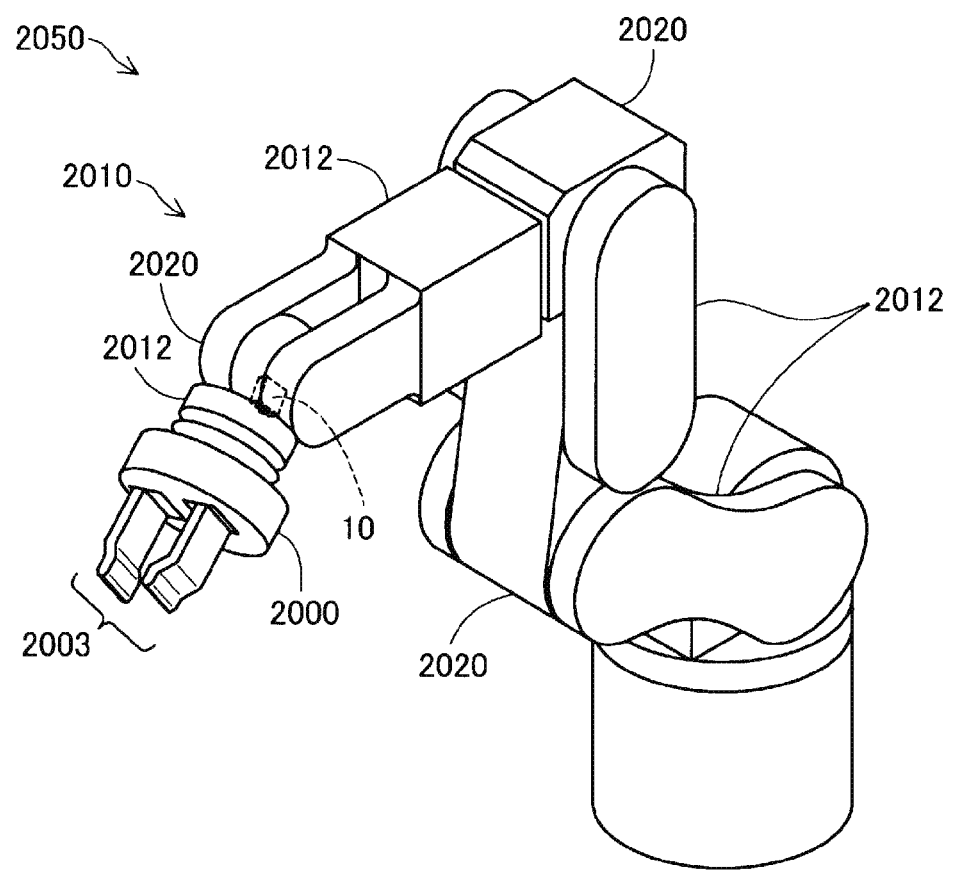
FIG. 11 is a view for describing an example of a robot which uses the piezoelectric drive device.

FIG. 11 is a view for describing an example of a robot 2050 which employs the above-described piezoelectric drive device 10. The robot 2050 has an arm 2010 (also referred to as an "arm unit") which includes multiple link portions 2012 (also referred to as a "link member") and multiple joint portions 2020 for connecting the link portions 2012 to each other in a pivotable or bendable state. The above-described piezoelectric drive device 10 is incorporated in the respective joint portions 2020, and the joint portions 2020 can be pivotally moved or bent at any desired angle by using the piezoelectric drive device 10. A robot hand 2000 is connected to a distal end of the arm 2010. The robot hand 2000 includes a pair of gripping portions 2003. The piezoelectric drive device 10 is also incorporated in the robot hand 2000. The robot hand 2000 can grip an object by using the piezoelectric drive device 10 so as to open and close the gripping portions 2003. The piezoelectric drive device 10 is also disposed between the robot hand 2000 and the arm 2010. The robot hand 2000 can be rotated with respect to the arm 2010 by using the piezoelectric drive device 10.

Figure 12:
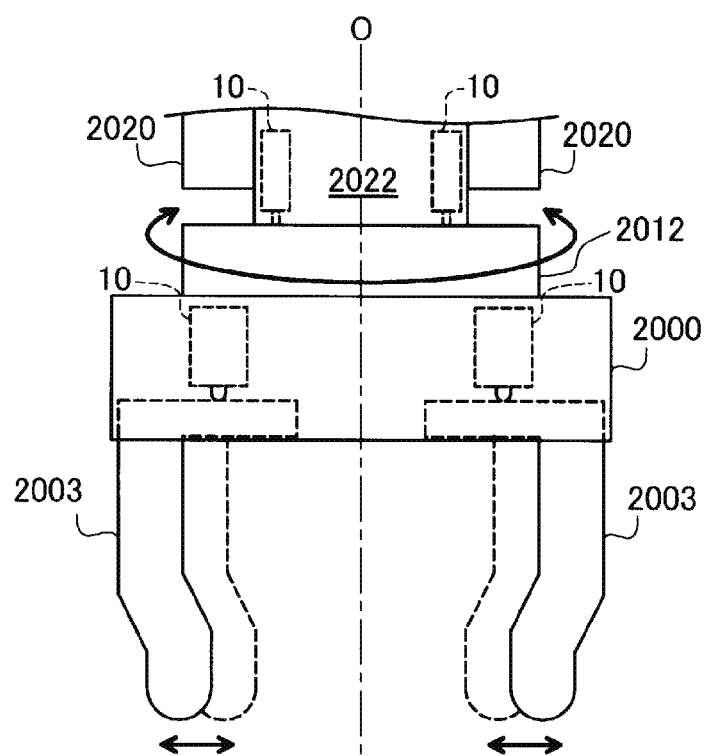
FIG. 12 is a view for describing a wrist portion of the robot.

FIG. 12 is a view for describing a wrist portion of the robot 2050 illustrated in FIG. 11. The joint portions 2020 on the wrist interpose a wrist pivotally moving portion 2022 therebetween, and the link portion 2012 on the wrist is attached to the wrist pivotally moving portion 2022 so as to be pivotally movable around a central axis O of the wrist pivotally moving portion 2022. The wrist pivotally moving portion 2022 includes the piezoelectric drive device 10. The piezoelectric drive device 10 pivotally moves the link portion 2012 on the wrist and the robot hand 2000 around the central axis O. The multiple gripping portions 2003 are erected in the robot hand 2000. A proximal end portion of the gripping portion 2003 is movable inside the robot hand 2000. The piezoelectric drive device 10 is mounted on a base portion of the gripping portion 2003. Therefore, the gripping portions 2003 are moved so as to grip a target by operating the piezoelectric drive device 10.

As the robot, without being limited to a single arm robot, the piezoelectric drive device 10 can also be applied to a multi-arm robot in which the number of arms is two or more. Here, in addition to the piezoelectric drive device 10, the joint portion 2020 on the wrist or the inside of the robot hand 2000 includes a power line for supplying power to various devices such as a force sensor and a gyro sensor or a signal line for transmitting a signal. Accordingly, enormous wiring is needed. Therefore, it was very difficult to arrange the wiring inside the joint portion 2020 or the robot hand 2000. However, the piezoelectric drive device 10 according to the above-described embodiments can decrease a drive current compared to a normal electric motor or the piezoelectric drive device in the related art. Therefore, it is possible to arrange the wiring even in a small space such as the joint portion 2020 (particularly, a distal end joint portion of the arm 2010) and the robot hand 2000.

Figure 13:
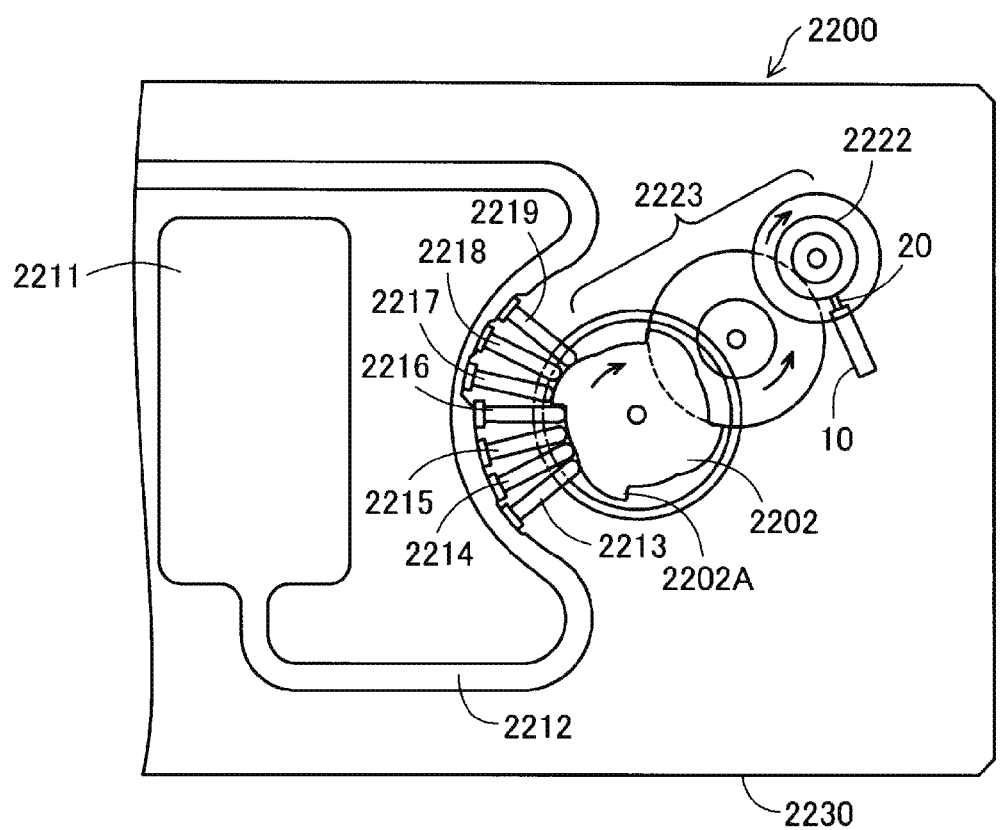
FIG. 13 is a view for describing an example of a liquid feeding pump which uses the piezoelectric drive device.

FIG. 13 is a view for describing an example of a liquid feeding pump 2200 employing the above-described piezoelectric drive device 10. In the liquid feeding pump 2200, a case 2230 internally has a reservoir 2211, a tube 2212, the piezoelectric drive device 10, a rotor 2222, a deceleration transmission mechanism 2223, a cam 2202, and multiple fingers 2213, 2214, 2215, 2216, 2217, 2218, and 2219. The reservoir 2211 is an accommodation section for accommodating a liquid which is a transport target. The tube 2212 is used in order to transport the liquid fed from the reservoir 2211. The contact member 20 of the piezoelectric drive device 10 is disposed in a state of being pressed against a side surface of the rotor 2222, and the piezoelectric drive device 10 rotatably drives the rotor 2222. A rotation force of the rotor 2222 is transmitted to the cam 2202 via the deceleration transmission mechanism 2223. The fingers 2213 to 2219 are members for blocking the tube 2212. If the cam 2202 is rotated, the fingers 2213 to 2219 are sequentially pressed radially outward by a protrusion portion 2202A of the cam 2202. The fingers 2213 to 2219 block the tube 2212 sequentially from the upstream side (reservoir 2211 side) in the transport direction. In this manner, the liquid inside the tube 2212 is sequentially transported to the downstream side. According to this configuration, an extremely small amount of the liquid can be accurately fed. Moreover, a miniaturized liquid feeding pump 2200 can be implemented. An arrangement of each member is not limited to the illustrated example. A configuration may be adopted in which a ball disposed in the rotor 2222 blocks the tube 2212 without providing the fingers. The above-described liquid feeding pump 2200 can be utilized for a drug dispensing apparatus which administers a drug solution such as insulin to a human body. Here, a drive current is decreased by using the piezoelectric drive device 10 according to the above-described embodiments, compared to the piezoelectric drive unit in the related art. Accordingly, it is possible to minimize power consumption of the drug dispensing apparatus. Therefore, the piezoelectric drive device 10 is particularly effective when the drug dispensing apparatus is driven by a battery.

Modification Example

Without being limited to the above-described examples or embodiments, the invention can be embodied in various aspects within the scope not departing from the gist of the invention. For example, the invention can also be modified as follows.

Modification Example 1

According to the above-described embodiments, the first electrode 130, the piezoelectric substance 140, and the second electrode 150 are formed on the substrate 120. However, the substrate 120 may be omitted, and the first electrode 130, the piezoelectric substance 140, and the second electrode 150 may be formed on the vibrating plate 200.

Modification Example 2

According to the above-described embodiments, each one of the piezoelectric vibrating bodies 100 is disposed on both surfaces of the vibrating plate 200. However, the piezoelectric vibrating body 100 may be disposed on only one surface of the vibrating plate 200. However, if each of the piezoelectric vibrating bodies 100 is disposed on both surfaces of the vibrating plate 200, it is preferable since the vibrating plate 200 is more easily deformed into a meandering shape which is bent inside a plane thereof.

Hitherto, the embodiments of the invention have been described with reference to some examples. However, the above-described embodiments are provided in order to facilitate the understanding of the invention, and are not intended to limit the invention. The invention can be modified or improved without departing from the gist and the scope of the appended claims, and the invention includes its equivalents as a matter of course.

The entire disclosure of Japanese Patent Application No. 2015-018398, filed Feb. 2, 2015 is expressly incorporated by reference herein.

What is claimed is:

1. A piezoelectric element drive circuit comprising:

a piezoelectric element array in which the N number (N is an integer of two or more) of piezoelectric elements respectively having a piezoelectric substance whose thickness is 0.05 μm to 20 μm and two electrodes interposing the piezoelectric substance therebetween are connected in series;

a first generation circuit that supplies a voltage including an AC component and a DC component to the piezoelectric element array; and a second generation circuit that supplies a voltage including the DC component to the M number (M is an integer of one or more) of connection points within the (N−1) number of connection points between two adjacent piezoelectric elements in the piezoelectric element array.

2. The piezoelectric element drive circuit according to claim 1, wherein the M is equal to the (N−1), and wherein the second generation circuit supplies voltages having respectively different voltage values to the (N−1) number of connection points.

3. The piezoelectric element drive circuit according to claim 1, wherein the voltage supplied by the second generation circuit is a DC voltage.

4. The piezoelectric element drive circuit according to claim 1, further comprising:

an inductor that is connected between the second generation circuit and the M number of connection points.

5. The piezoelectric element drive circuit according to claim 1, wherein the second generation circuit includes a voltage divider circuit which generates a voltage supplied to the M number of connection points by dividing the voltage supplied from the first generation circuit.

6. The piezoelectric element drive circuit according to claim 5, wherein the voltage divider circuit includes a resistance element array in which multiple resistance elements are connected in series.

7. The piezoelectric element drive circuit according to claim 6, wherein the voltage divider circuit includes an inductor which is connected to the resistance element array in series.

8. A robot comprising:

multiple link portions;

a joint portion that connects the multiple link portions to each other; and the piezoelectric element drive circuit according to claim 1, which pivotally moves the multiple link portions in the joint portion by using the piezoelectric element.

9. A robot comprising:

multiple link portions;

a joint portion that connects the multiple link portions to each other; and the piezoelectric element drive circuit according to claim 2, which pivotally moves the multiple link portions in the joint portion by using the piezoelectric element.

10. A robot comprising:
multiple link portions;
a joint portion that connects the multiple link portions to each other; and
the piezoelectric element drive circuit according to claim 3, which pivotally moves the multiple link portions in the joint portion by using the piezoelectric element.

11. A robot comprising:
multiple link portions;
a joint portion that connects the multiple link portions to each other; and
the piezoelectric element drive circuit according to claim 4, which pivotally moves the multiple link portions in the joint portion by using the piezoelectric element.

12. A robot comprising:
multiple link portions;
a joint portion that connects the multiple link portions to each other; and
the piezoelectric element drive circuit according to claim 5, which pivotally moves the multiple link portions in the joint portion by using the piezoelectric element.

13. A robot comprising:
multiple link portions;
a joint portion that connects the multiple link portions to each other; and
the piezoelectric element drive circuit according to claim 6, which pivotally moves the multiple link portions in the joint portion by using the piezoelectric element.

14. A robot comprising:
multiple link portions;
a joint portion that connects the multiple link portions to each other; and
the piezoelectric element drive circuit according to claim 7, which pivotally moves the multiple link portions in the joint portion by using the piezoelectric element.

* * * * *